US011171105B2

(12) United States Patent
Huang

(10) Patent No.: US 11,171,105 B2
(45) Date of Patent: Nov. 9, 2021

(54) SEMICONDUCTOR PACKAGE AND MANUFACTURING METHOD OF THE SAME

(71) Applicant: Advanced Semiconductor Engineering, Inc., Kaohsiung (TW)

(72) Inventor: Hsin He Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/683,128

(22) Filed: Nov. 13, 2019

(65) Prior Publication Data

US 2021/0143117 A1 May 13, 2021

(51) Int. Cl.
| | | |
|---|---|---|
| H01L 23/00 | (2006.01) | |
| H01L 23/538 | (2006.01) | |
| H01L 25/00 | (2006.01) | |
| H01L 21/683 | (2006.01) | |
| H01L 21/304 | (2006.01) | |

(52) U.S. Cl.
CPC ............ H01L 24/14 (2013.01); H01L 21/304 (2013.01); H01L 21/6838 (2013.01); H01L 23/5389 (2013.01); H01L 25/00 (2013.01); H01L 2224/1403 (2013.01); H01L 2224/14051 (2013.01); H01L 2224/14515 (2013.01)

(58) Field of Classification Search
CPC ...... H01L 23/5389; H01L 24/14; H01L 25/00
See application file for complete search history.

(56) References Cited

U.S. PATENT DOCUMENTS

| | | | | |
|---|---|---|---|---|
| 6,462,420 | B2 * | 10/2002 | Hikita | ..................... H01L 24/10 |
| 2003/0034168 | A1 * | 2/2003 | Yang | ....................... H01L 24/17 |
| | | | | 174/558 |
| 2013/0127048 | A1 * | 5/2013 | Hasegawa | ............. H01L 21/561 |
| | | | | 257/737 |
| 2014/0167254 | A1 * | 6/2014 | Yu | ........................... H01L 24/11 |
| | | | | 257/737 |

\* cited by examiner

*Primary Examiner* — Peniel M Gumedzoe
(74) *Attorney, Agent, or Firm* — Foley & Lardner LLP

(57) ABSTRACT

A semiconductor device includes a semiconductor die having a first surface and a second surface opposite to the first surface, a plurality of first real conductive pillars in a first region on the first surface, and a plurality of supporters in a second region adjacent to the first region. An area density of the plurality of supporters in the second region is in a range of from about 50% to about 100% to an area density of the plurality of first real conductive pillars in the first region. A method for manufacturing a semiconductor package including the semiconductor device is also disclosed in the present disclosure.

18 Claims, 10 Drawing Sheets

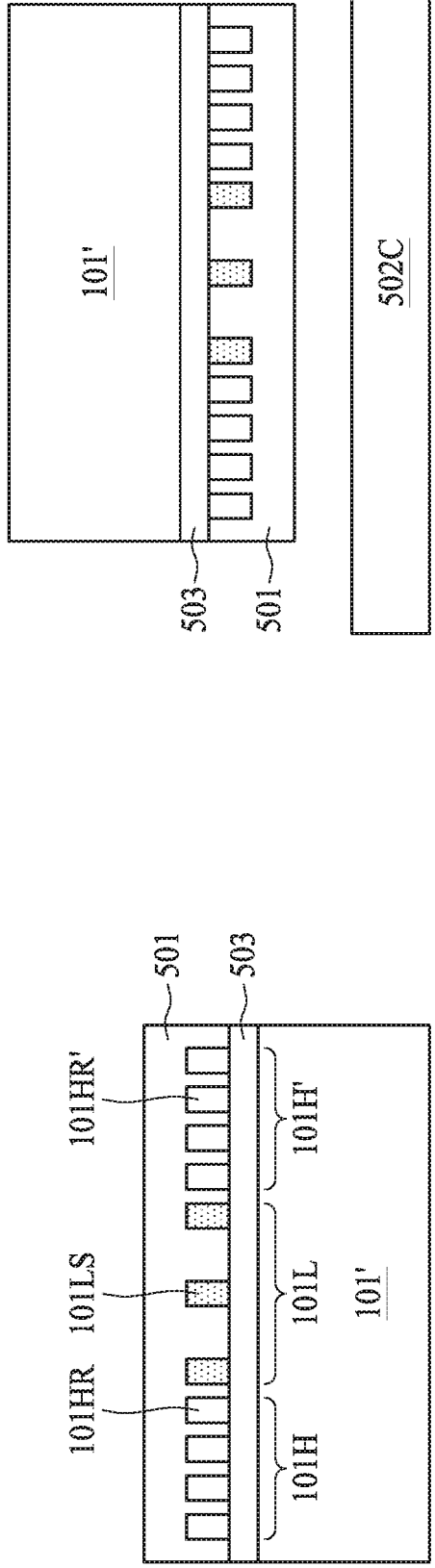
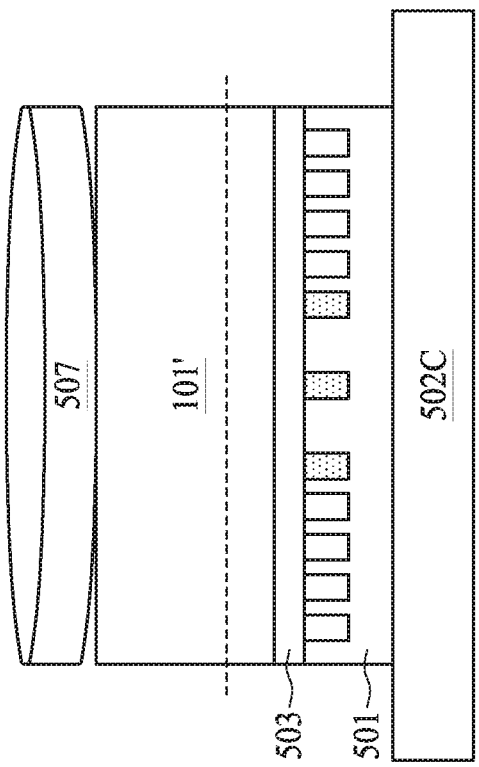
FIG. 5A"
FIG. 5B"
FIG. 5C"

SEMICONDUCTOR PACKAGE AND MANUFACTURING METHOD OF THE SAME

BACKGROUND

1. Technical Field

The present disclosure relates to a semiconductor package, particularly, to a semiconductor package including a semiconductor die having a dense connection region and a sparse connection region.

2. Description of the Related Art

To adapt for the development of mobile communication devices, volume reduction (e.g., thinning), manufacturing cost reduction, function flexibility, and expedited product cycle are desired for device packaging.

Grinding is an approach in semiconductor packaging in reducing package thickness. Generally speaking, for a semiconductor die having an active surface disposed with a plurality of conductive pillars, a tape is attached to the active surface and covering the plurality of conductive pillars. Due to the flexible nature of the tape, a bottom of the tape may deform in compliance to the topography of the underlying conductive pillars whereas a top of the tape being substantially flat.

SUMMARY

In some embodiments, the present disclosure provides a semiconductor device, including a semiconductor die having a first surface and a second surface opposite to the first surface, a plurality of first real conductive pillars in a first region on the first surface, and a plurality of supporters in a second region adjacent to the first region. An area density of the plurality of supporters in the second region is in a range of from about 50% to about 100% to an area density of the plurality of first real conductive pillars in the first region.

In some embodiments, the present disclosure provides a semiconductor package, including a first semiconductor die having a first surface and a second surface opposite to the first surface, a plurality of first real conductive pillars in a first dense region on the first surface, a plurality of second real conductive pillars in a second dense region on the first surface, a plurality of supporters in a sparse region between the first dense region and the second dense region, a second semiconductor die over the first semiconductor die, and a third semiconductor die (300) over the first semiconductor die.

In some embodiments, the present disclosure provides method for manufacturing a semiconductor package, the method including forming a plurality of first real conductive pillars in a first region of a first surface of a semiconductor die, introducing an anti-deformation means at a second region of the first surface, the second region being adjacent to the first region, fixating the semiconductor die by providing a suction force at the first surface, and thinning the semiconductor die at a second surface opposite to the first surface.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
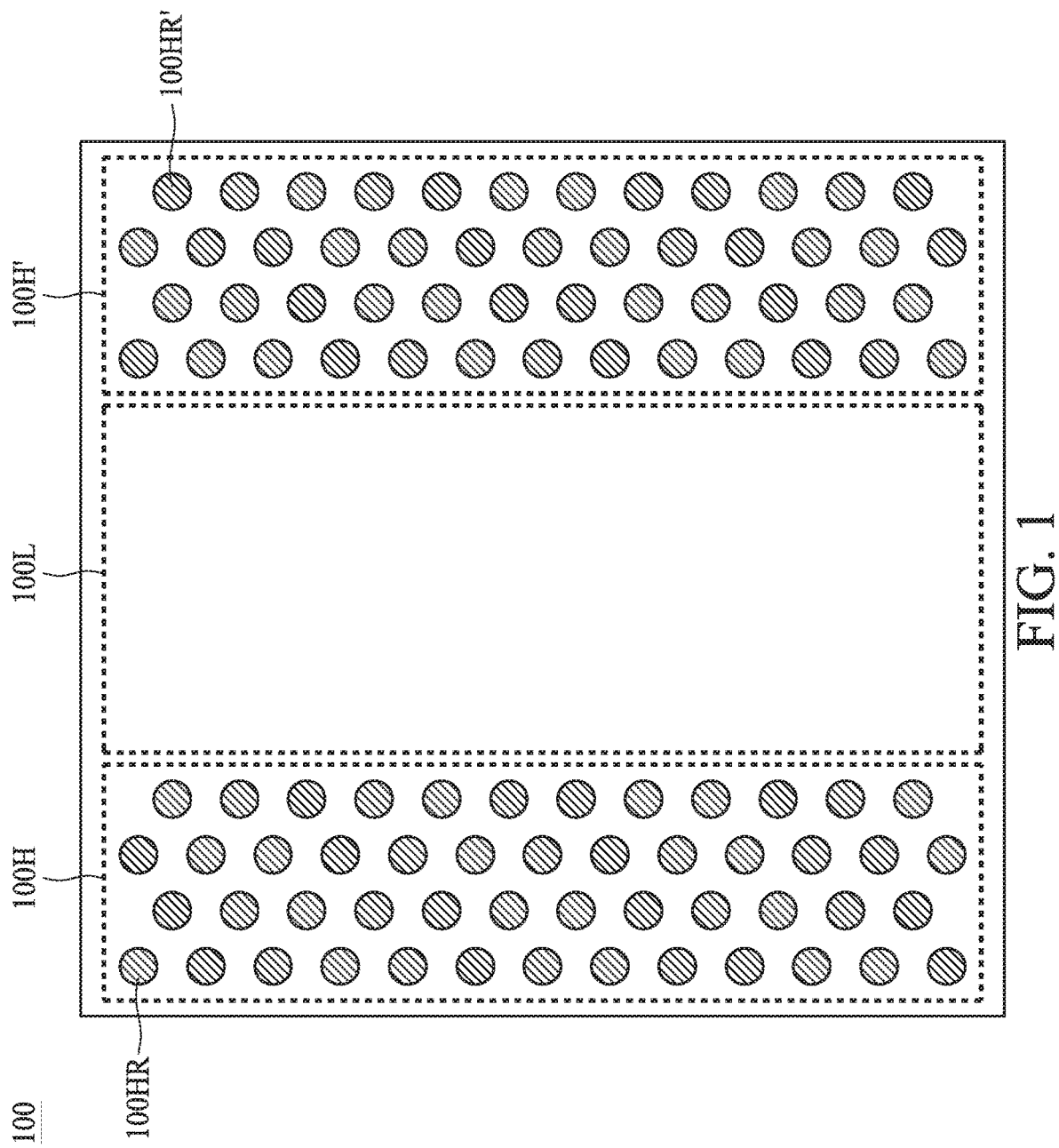
FIG. 1 illustrates a top view of a semiconductor die in a semiconductor package according to some comparative embodiments.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Referring to the semiconductor die having an active surface attached with a flexible tape, when a dense region (with greater volume density in terms of conductive pillars per unit volume) and a sparse region (with smaller or even zero volume density in terms of conductive pillars per unit volume) are presented on the active surface of the semiconductor die, the top surface of the tape may no longer maintain a flat morphology across the dense region and the sparse region. A step height difference at the top surface of the tape may be created at the boundary of the dense region and the sparse region. In a macroscopic point of view, a recess is formed over the sparse region due to the fact that more volume of the tape is used to fill the gaps in the sparse region, and less volume of the tape is used to fill the gaps between conductive pillars in the dense region.

In the subsequent backside grinding operation, the tape is brought in contact with a chuck table applying vacuum suction to the semiconductor die at the tape side. During the thinning process, when a thickness of the semiconductor die is greater than 100 μm, the vacuum suction may not form sufficient mechanical impact to the extent deforming the semiconductor die at the area adjacent to the recess of the tape. However, when the thickness of the semiconductor die is under 100 μm, said vacuum suction may form sufficient mechanical impact to the extent deforming the semiconductor die at the area adjacent to the recess of the tape.

When the deformation of the semiconductor die at the area adjacent to the recess of the tape, that is, at the sparse region, is presented, subsequent exposure of the conductive pillars in the dense region and sparse region (if any) by a molding compound planarization operation may render a total thickness variation (TTV) of all conductive pillars greater than 7 μm. The aforesaid TTV may beyond the processing error window of the molding compound planarization operation and may cause some of the conductive pillars in the sparse region (if any) to be nearly removed.

Present disclosure provides a semiconductor package structure implementing a plurality of supporters in the sparse region. The extra supporters may prevent the formation of the recess on the tape in the sparse region, and reduce the impact of semiconductor die deformation which leads to high TTV.

Present disclosure provides a method for manufacturing such semiconductor package structure implementing a plurality of supporters in the sparse region.

Present disclosure provides a method for manufacturing a semiconductor structure that is free of high TTV problem due to semiconductor die deformation at backside grinding stage. For example, mechanical supports designed at the chuck table providing vacuum suction can be implemented to prevent the deformation. For another example, protrusions designed at the chuck table eliminating the recess on the tape over the sparse region may be implemented to prevent the deformation.

Referring to FIG. 1, FIG. 1 illustrates a top view of a semiconductor die 100 in a semiconductor package according to some comparative embodiments. FIG. 1 shows an active surface of a semiconductor die 100, where the active surface includes a dense region 100H, a dense region 100H', and a sparse region 100L between the dense region 100H and the dense region 100H'. A plurality of conductive pillars 100HR are disposed in the dense region 100H, and a plurality of conductive pillars are disposed in the dense region 100H. In some comparative embodiments, the conductive pillars 100HR and 100HR' are electrically coupled to conductive traces at the vicinity of the active surface of the semiconductor die 100 at one end, and/or electrically coupled to another conductive wiring layer (e.g., a redistribution layer RDL) at the other end. Alternatively stated, the conductive pillars 100HR and 100HR' are real conductive pillars serving the purpose of electrical connection in the semiconductor package incorporating the semiconductor die 100. It is observable that an area density of the conductive pillars 100HR in the dense region 100H is greater than an area density of the conductive pillars, if any, in the sparse region 100L. In some comparative embodiments, a volume density of the conductive pillars 100HR in the dense region 100H is greater than a volume density of the conductive pillars, if any, in the sparse region 100L when a height of each of the conductive pillars 100HR, 100HR' is considered. In some comparative embodiments, the conductive pillars 100HR and 100 HR' can be copper pillars, copper studs, copper bumps, or the like, regardless of specific dimensions, aspect ratios and shapes.

Figure 2:
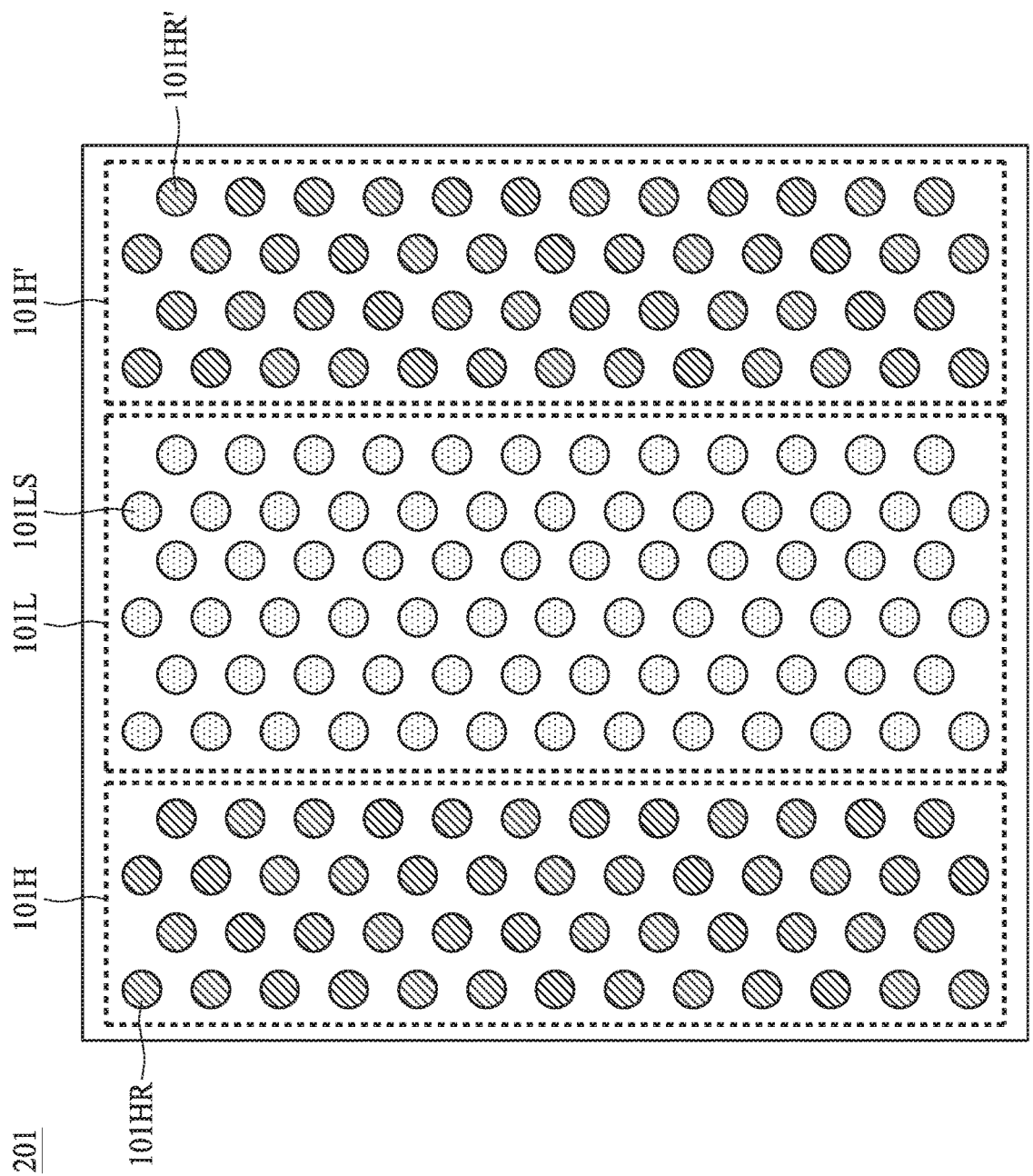
FIG. 2 illustrates a top view of a semiconductor die in a semiconductor package according to some embodiments of the present disclosure.

Referring to FIG. 2, FIG. 2 illustrates a top view of a semiconductor die 201 in a semiconductor package according to some embodiments of the present disclosure. FIG. 2 shows an active surface of a semiconductor die 201, where the active surface includes a dense region 101H (enclosed by dotted lines), a dense region 101H' (enclosed by dotted lines), and a sparse region 101L (enclosed by dotted lines) between the dense region 101H and the dense region 101H'. A plurality of conductive pillars 101HR are disposed in the dense region 101H, and a plurality of conductive pillars 101HR' are disposed in the dense region 101H'. A plurality of supporters 101LS are disposed in the sparse region 101L.

In some embodiments, the conductive pillars 101HR and 101HR' are electrically coupled to conductive traces at the vicinity of the active surface of the semiconductor die 201 at one end, and/or electrically coupled to another conductive wiring layer (e.g., a redistribution layer RDL) at the other end. Alternatively stated, the conductive pillar 101HR and 101HR' are real conductive pillars serving the purpose of electrical connection in the semiconductor package incorporating the semiconductor die 201. The supporters 101LS, at one end, can be disposed on conductive pads which may or may not couple to conductive traces at the vicinity of the active surface of the semiconductor die 201. At the other end, the supporters 101LS may not electrically coupled to another conductive wiring layer (e.g., a redistribution layer RDL). Alternatively stated, the supporters 101LS can include dummy conductive pillars which do not serve the purpose of electrical connection in the semiconductor package incorporating the semiconductor die 101A. In some embodiments, the supporters 101LS may include both real conductive pillars and dummy conductive pillars.

It is observable that an area density of the conductive pillars 101HR in the dense region 100H is greater than an area density of the supporters 101LS in the sparse region 101L. In some embodiments, a volume density of the conductive pillars 101HR in the dense region 101H is greater than a volume density of the supporters 101LS in the sparse region 101L when a height of each of the conductive pillars 101HR and the supporters 101LD is considered. In some embodiments, the conductive pillars 101HR and the supporters 101LScan be copper pillars, copper studs, copper bumps, or the like, regardless of specific dimensions, aspect ratios and shapes. Similarly, an area density of the conductive pillars 101HR' in the dense region 100H' is greater than an area density of the supporters 101LS in the sparse region 101L. A volume density of the conductive pillars 101HR' in the dense region 101H' is greater than a volume density of the supporters 101LS in the sparse region 101L.

As illustrated in FIG. 2, from a top view perspective, the supporters 101LS in the sparse region 101L of the semiconductor die 201 have an identical shape, for example, a circular shape, as the conductive pillars 101HR and 101HR' in the dense region 101H, 101H'. In some embodiments, when all the conductive pillars 101HR, 101HR', and supporters 101LS are formed on the active surface of the semiconductor die 101A, an optical inspection can be performed to filter the semiconductor dies with defective conductive pillars, for example, slanted pillars or broken pillars. When the defective conductive pillars are identified as one of the dummy supporters 101LS, the semiconductor die may not contribute to the yield loss.

Figure 3:
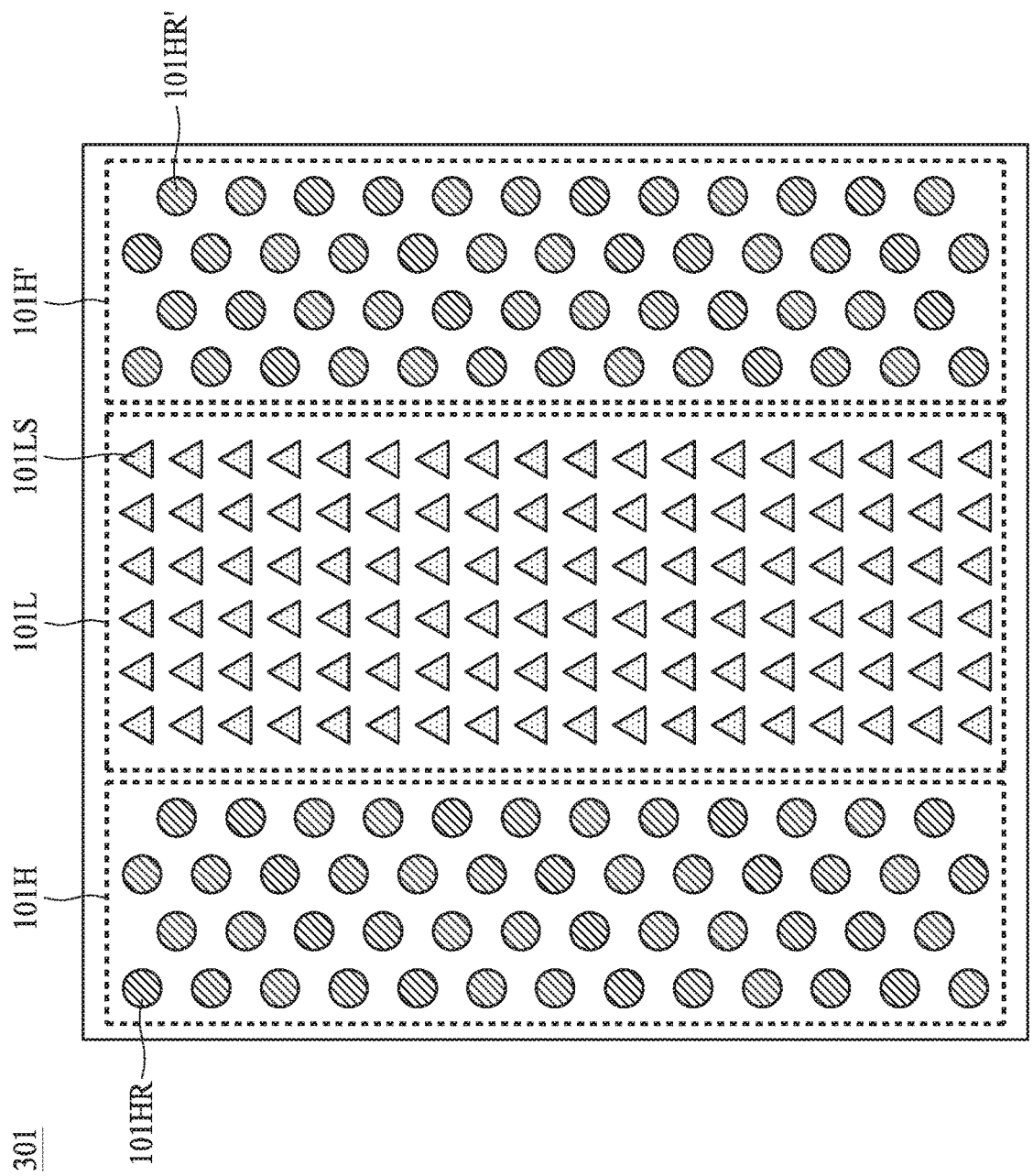
FIG. 3 illustrates a top view of a semiconductor die in a semiconductor package according to some embodiments of the present disclosure.

FIG. 3 illustrates a top view of a semiconductor die 301 in a semiconductor package according to some embodiments of the present disclosure. FIG. 3 shows an active surface of a semiconductor die 301, where the active surface includes a dense region 101H (enclosed by dotted lines), a dense region 101H' (enclosed by dotted lines), and a sparse region 101L (enclosed by dotted lines) between the dense region 101H and the dense region 101H'. A plurality of conductive pillars 101HR are disposed in the dense region 101H. A plurality of conductive pillars 101HR' are disposed in the dense region 101H'. A plurality of supporters 101LS are disposed in the sparse region 101L.

In some embodiments, the conductive pillars 101HR and 101HR' are electrically coupled to conductive traces at the vicinity of the active surface of the semiconductor die 301 at one end, and/or electrically coupled to another conductive wiring layer (e.g., a redistribution layer RDL) at the other end. Alternatively stated, the conductive pillar 101HR and 101HR' are real conductive pillars serving the purpose of electrical connection in the semiconductor package incorporating the semiconductor die 301. The supporters 101LS, at one end, can be disposed on conductive pads which may or may not couple to conductive traces at the vicinity of the active surface of the semiconductor die 301. At the other end, the supporters 101LS may not electrically coupled to another conductive wiring layer (e.g., a redistribution layer RDL). Alternatively stated, the supporters 101LS can be dummy conductive pillars which do not serve the purpose of electrical connection in the semiconductor package incorporating the semiconductor die 101B. In some embodiments, the supporters 101LS may include both real conductive pillars and dummy conductive pillars.

It is observable that an area density of the conductive pillars 101HR in the dense region 100H is greater than an area density of the supporters 101LS in the sparse region 101L. In some embodiments, a volume density of the conductive pillars 101HR in the dense region 101H is greater than a volume density of the supporters 101LS in the sparse region 101L when a height of each of the conductive pillars 101HR and the supporters 101LS is considered. In some embodiments, the conductive pillars 101HR and the supporters 101LS can be copper pillars, copper studs, copper bumps, or the like, regardless of specific dimensions, aspect ratios and shapes. Similarly, an area density of the conductive pillars 101HR' in the dense region 100H' is greater than an area density of the supporters 101LS in the sparse region 101L. A volume density of the conductive pillars 101HR' in the dense region 101H' is greater than a volume density of the supporters 101LS in the sparse region 101L.

As illustrated in FIG. 3, from a top view perspective, the supporters 101LS in the sparse region 101L of the semiconductor die 301 have shapes, for example, a triangular shape, different from the shape of conductive pillars 101HR, for example, a circular shape, in the dense region 101H. In some embodiments, the shape of the supporters 101LS in the sparse region 101L is different from the shape of the conductive pillars 101HR in the dense region 101H. In some embodiments, when all the conductive pillars 101HR, 101HR', and the supporters 101LS are formed on the active surface of the semiconductor die 301, an optical inspection can be performed to filter the semiconductor dies with defective conductive pillars, for example, slanted pillars or broken pillars. When the defective conductive pillars are identified as one of the supporters 101LS, the semiconductor die may not contribute to the yield loss. The supporters 101LS illustrated in FIG. 3 can facilitate the aforesaid identification process because the triangular shape shown in the inspection may indicate a supporter 101LS and the circular shape a real conductive pillar 101HR or 101HR'.

Figure 4:
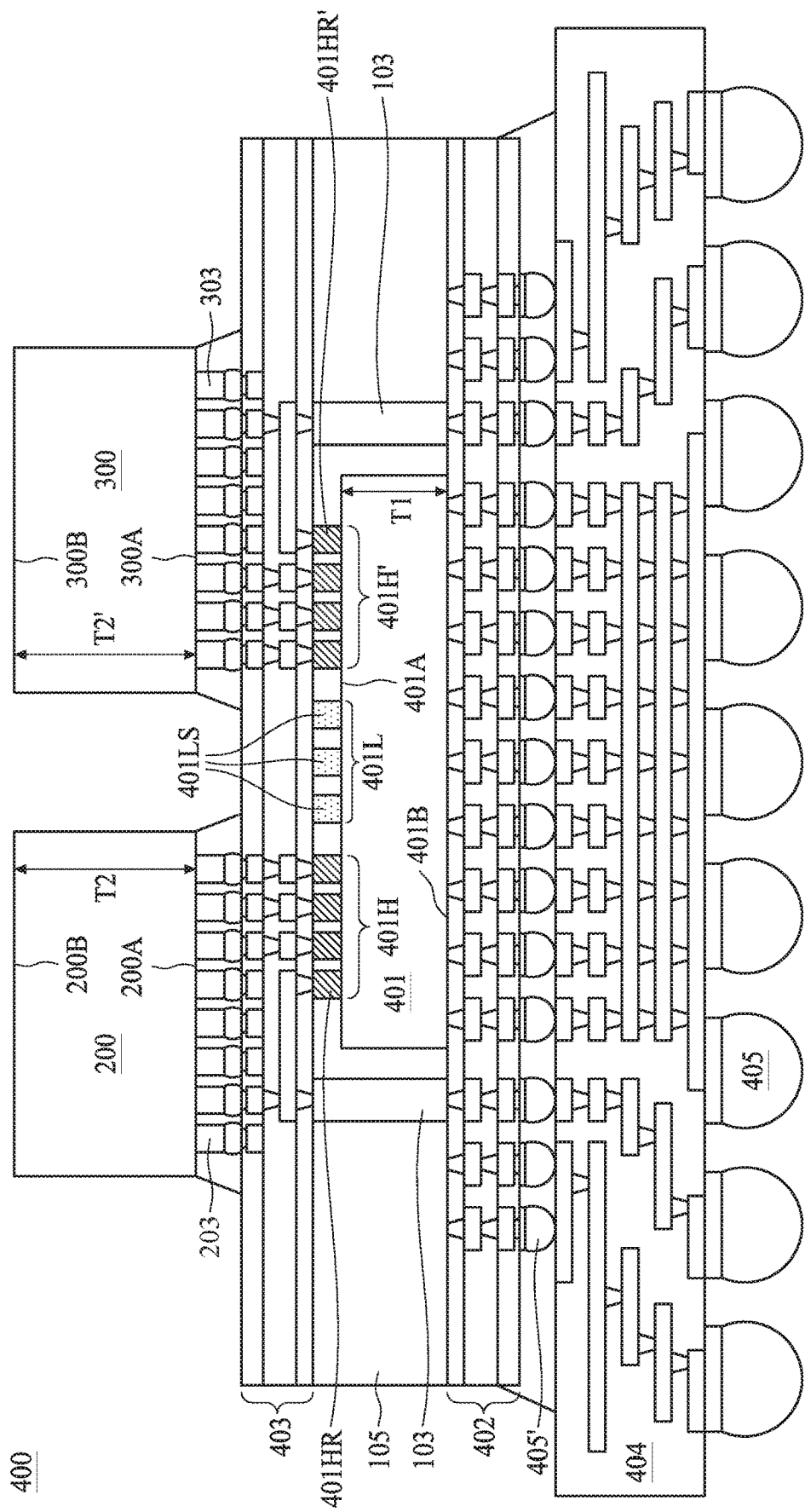
FIG. 4 illustrates a cross-sectional view of a semiconductor package according to some embodiments of the present disclosure.

FIG. 4 illustrates a cross-sectional view of a semiconductor package 400 according to some embodiments of the present disclosure. The semiconductor package 400 includes a semiconductor die 401 having an active surface 401A and a passive surface 401B opposite to the active surface 401A. The active surface 401A has at least a dense region 401H, a dense region 401H', and a sparse region 401L where the area density of the plurality of real conductive pillars 401HR in the dense region 401H is greater than the area density of the supporters 401LS in the sparse region 401L. In the sparse region 401L of the active surface 401A, a plurality of supporters 401LS are disposed therein. Although not illustrated in FIG. 4, the active surface 401A of the semiconductor die 401 may include a conductive wiring layer (e.g., an RDL) electrically connecting the active regions in the semiconductor die 401 and the plurality of real conductive pillars 401HR, 401HR'.

Taking the volume (e.g., a projection area and a height) of each of the real conducive pillars 401HR, 401HR' and supporters 401LS into consideration, the supporters 401LS in the sparse region 401L can possess a first volume density (e.g., the volume of the supporters 401LS per unit volume in the sparse region 401L). On the other hand, the real conductive pillars 401HR or 401HR' in the dense region 401H or 401H' can possess a second volume density (e.g., the volume of the real conductive pillars 401HR or 401HR' per unit volume in the dense region 401H or 401H'). In some embodiments, the first volume density may be equal to or smaller than the second volume density. In some embodiments, the first volume density is at least about 50% of the second volume density. In some embodiments, the first volume density is in a range of from about 50% to about 100% of the second volume density. As previously addressed, the presence of the supporters 401LS in the sparse region 401L with the aforesaid volume density can effectively reduce the TTV of all conducive pillars 401HR, 401HR', and supporters 401LS on the active surface 401A of the semiconductor die 401 in the semiconductor package 400.

Taking the area (e.g., a projection area) of each of the real conducive pillars 401HR, 401HR' and supporters 401LS into consideration, the supporters 401LS in the sparse region 401L can possess a first area density (e.g., the projection area of the supporters 401LS per unit area in the sparse region 401L). On the other hand, the real conductive pillars 401HR or 401HR' in the dense region 401H or 401H' can possess a second area density (e.g., the area of the real conductive pillars 401HR or 401H' per unit area in the dense region 401H). In some embodiments, the first area density may be equal to or smaller than the second area density. In some embodiments, the first area density is at least about 50% of the second area density. In some embodiments, the first area density is in a range of from about 50% to about 100% of the second area density. As previously addressed, the presence of the supporters 401LS in the sparse region 401L with the aforesaid area density can effectively reduce the TTV of all conducive pillars 401HR, 401HR', and supporters 401LS on the active surface 401A of the semiconductor die 401 in the semiconductor package 400.

Still referring to FIG. 4, the semiconductor package 400 further includes an encapsulant 105 surrounding the plurality of real conductive pillars 401HR or 401HR' in the dense region 401H or 401H', the plurality of supporters 401LS in the sparse region 401L. As illustrated in FIG. 4, all the conductive pillars 401HR, 401HR', and supporters 401LS on the active surface 401A may possess a same height. A top end of the supporters 401LS may be in contact with a conductive wiring layer 403 (e.g., an RDL) proximal to the active surface 401A of the semiconductor die 401 but without electrical connection with the conductive traces or pads of the conductive wiring layer 403. In addition to the conductive wiring layer 403, the semiconductor package 400 further includes a conductive wiring layer 402 (e.g., an RDL) proximal to the passive surface 401B of the semiconductor die 401. The conductive wiring layer 402 may be electrically connected to the active surface 401A of the semiconductor die 401 via the through via 103 in the encapsulant 105 and any one of the real conductive pillars 401HR, 401HR, supporters 401LS, in the dense region 401H, 401H', and sparse region 401L, respectively.

Still referring to FIG. 4, the semiconductor package 400 further includes a semiconductor die 200 over the conductive wiring layer 403 and partially overlapping with a portion of the semiconductor die 401. The semiconductor die 200 has an active surface 200A and a passive surface 200B opposite to the active surface 200A. In some embodiments, the semiconductor die 200 possess a plurality of conductive terminals 203 on the active surface 200A which are electrically connected to the semiconductor die 401. In some embodiments, the plurality of conductive terminals 203 of the semiconductor die 200 overlap with and electrically connected to the plurality of real conductive pillars 401HR in the dense region 401H of the semiconductor die 401. In other words, the plurality of supporters 401LS in the sparse region 401L of the semiconductor die 401 may or may not be electrically connected to the semiconductor die 200 but the supporters 401LS in the sparse region 401L may be partially overlapping with the semiconductor die 200.

Still referring to FIG. 4, the semiconductor package 400 further includes a semiconductor die 300 over the conductive wiring layer 403 and partially overlapping with a portion of the semiconductor die 401. The semiconductor die 300 has an active surface 300A and a passive surface 300B opposite to the active surface 300A. In some embodiments, the semiconductor die 300 possess a plurality of conductive terminals 303 on the active surface 300A which are electrically connected to the semiconductor die 401. In some embodiments, the plurality of conductive terminals 303 of the semiconductor die 300 overlap with and electrically connected to the plurality of real conductive pillars 401HR' in the dense region 401H' of the semiconductor die 401. In other words, the plurality of supporters 401LS in the sparse region 401L of the semiconductor die 401 may or may not be electrically connected to the semiconductor die 300 but the supporters 401LS in the sparse region 401L may be partially overlapping with the semiconductor die 300.

Still referring to FIG. 4, the semiconductor package 400 further includes a substrate 404 carrying the semiconductor die 401, the semiconductor die 200, and the semiconductor die 300. The size of conductive terminals 405' on the top surface of the substrate 404 is finer than the size of conductive terminals 405 on the bottom surface of the substrate 404. In some embodiments, the size of conductive terminals 203 on the active surface 200A of the semiconductor die 200 is finer than the size of the conductive terminal 405' on the top surface of the substrate 404. In some embodiments, a thickness T1 of the semiconductor die 401 is thinner than a thickness T2 of the semiconductor die 200 or a thickness T3 of the semiconductor die 300. In some embodiments, the thickness T1 is less than about 100 µm, for example, about 50 µm. The thickness T2 and the thickness T2' are greater than about 100 µm, for example, about 250 µm. As previously discussed, when the thickness of the semiconductor die is under 100 µm, the vacuum suction applied on the surface of the semiconductor die may form sufficient mechanical impact to the extent deforming the semiconductor die at the area lack of mechanical support. In the present disclosure, when the supporters 401LS are implemented in the sparse region 401L, deformation resistance at the sparse region 401L can be effectively increased due to the formation of a conformal interface between the tape covering the supporters 401LS and the chuck table providing vacuum suction.

Figure 5A:
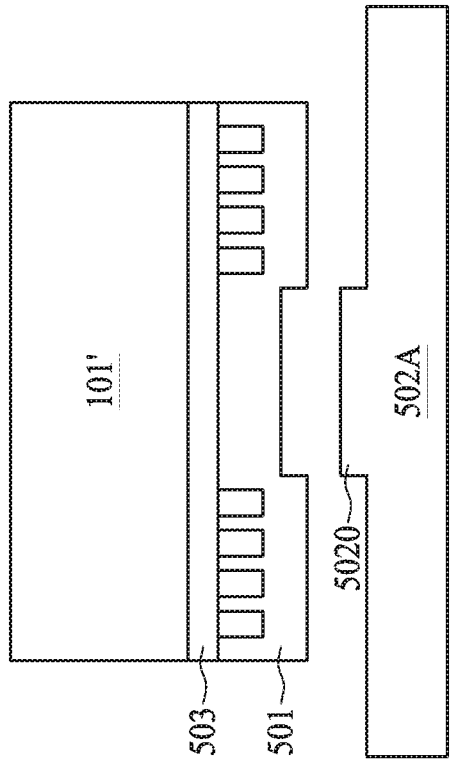
FIG. 5A, FIG. 5B, and FIG. 5C illustrate cross sectional views of intermediate products during various manufacturing operations of a semiconductor package according to some embodiments of the present disclosure.
Figure 5B:
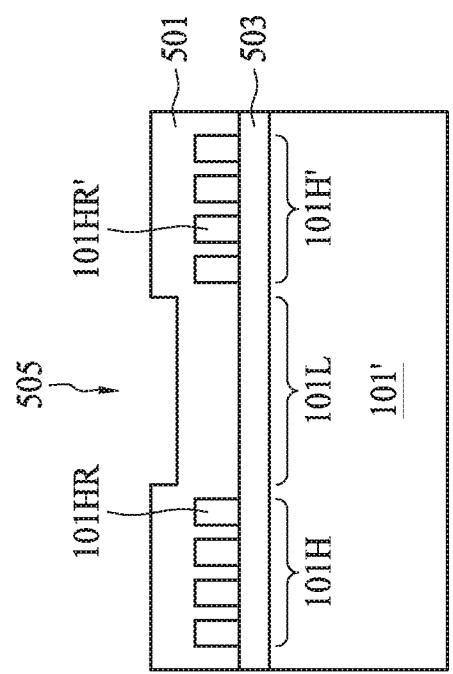
Figure 5C:
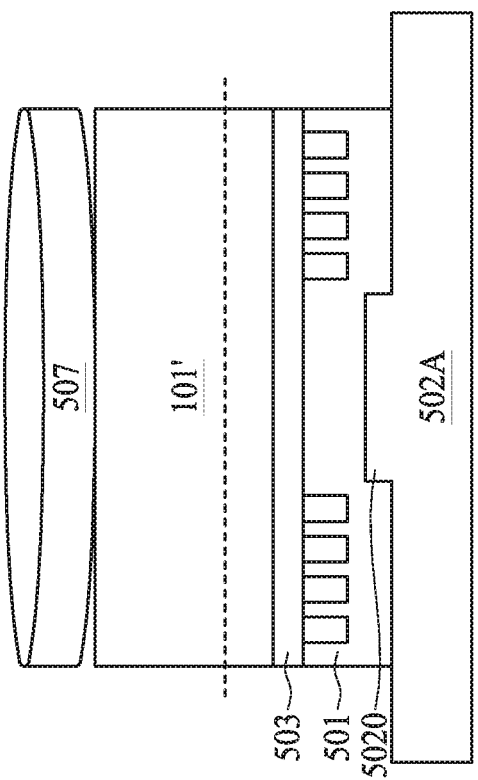
Figure 5A:
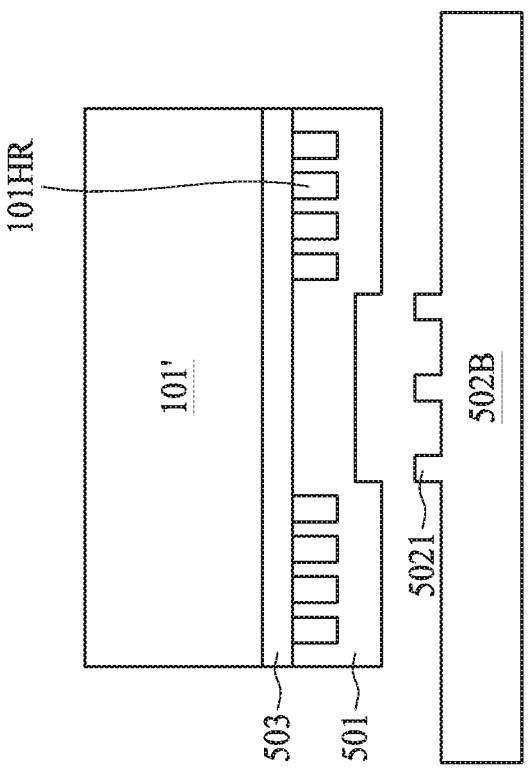
Figure 5B:
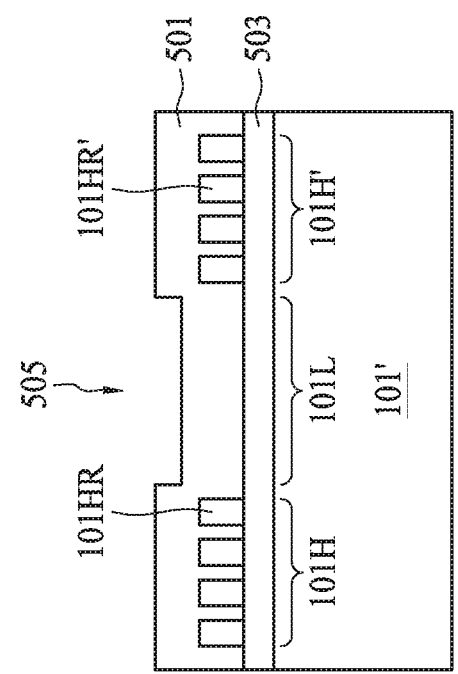
Figure 5C:
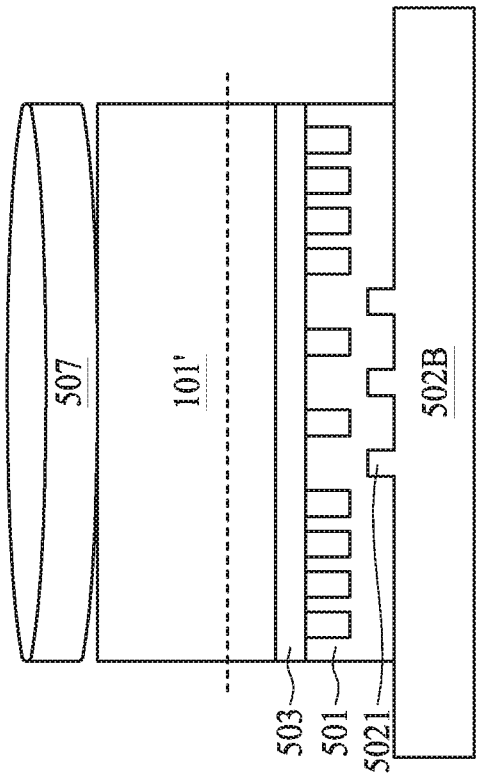

FIG. 5A, FIG. 5B, and FIG. 5C illustrate cross sectional views of intermediate products during various manufacturing operations of a semiconductor package according to some embodiments of the present disclosure. In FIG. 5A, a semiconductor wafer having a plurality of semiconductor die regions are provided. FIG. 5A selectively illustrates a cross sectional view of a die region of a wafer. The semiconductor die 101' includes a sparse region 101L at an active surface and more than one dense regions 101H, 101H' adjacent to the sparse region 101L. The active surface of the semiconductor die 101' includes a conductive wiring layer 503 (e.g., an RDL) disposed between the active regions in the semiconductor die 101' and the plurality of real conductive pillars 101HR, 101HR' in the dense region 101H, 101H'. In some embodiments, the plurality of real conductive pillars 101HR, 101HR' are formed by suitable electroplating operations. In some embodiments, the plurality of real conductive pillars 101HR, 101HR' are formed in a single electroplating operation, each of the plurality of real conductive pillars 101HR, 101HR' is approximately having a same height.

A deformable layer, for example, a tape 501, is applied over the active surface of the semiconductor die 101' and covering the plurality of real conductive pillars 101HR, 101HR' in the dense region 101H, 101H', and the sparse region 101L. In some embodiments, a thickness of the tape 501 is determined to cover the top of each of the real conductive pillars 101H, 101H'. As previously addressed, a recess 505 is formed over the sparse region 101L due to the fact that more volume of the tape is used to fill the gaps in the sparse region 101L, and less volume of the tape is used to fill the gaps between real conductive pillars 101HR or 101HR' in the dense region 101H or 101H'.

In FIG. 5B, the semiconductor die 101' is brought to contact with a chuck table 502A which provides vacuum suction to fixate the semiconductor die 101' while performing a thinning operation illustrated in FIG. 5C. In some embodiments, the chuck table 502A includes an anti-deformation means 5020 which provides mechanical support to the sparse region 101L of the semiconductor die 101' so that the sparse region 101L of the semiconductor die 101' will not deform in response to the vacuum suction force when thinned beyond a critical thickness, for example, less than 100 μm. In some embodiments, the anti-deformation means 5020 is a protrusion on the chuck table 502A, and the protrusion is designed to have a surface conforming to the recess 505 of the tape 501. In FIG. 5C, a thinning operation is performed from a passive surface toward the active surface of the semiconductor die 101' to obtain a desired die thickness. In some embodiments, a chemical mechanical polishing (CMP) operation is performed via a grinding wheel 507 in order to remove a substantial thickness of the semiconductor die 101' until the remaining thickness to be less than about 100 μm.

FIG. 5A', FIG. 5B', and FIG. 5C' illustrate cross sectional views of intermediate products during various manufacturing operations of a semiconductor package according to some embodiments of the present disclosure. Description to FIG. 5A' and FIG. 5C' can be referred to paragraphs addressing FIG. 5A and FIG. 5C and is not repeated here for brevity. In FIG. 5B', the semiconductor die 101' is brought to contact with a chuck table 502B which provides vacuum suction to fixate the semiconductor die 101' while performing a thinning operation illustrated in FIG. 5C'. In some embodiments, the chuck table 502B includes an anti-deformation means 5021 which eliminates the recess 505 of the tape 501 at the sparse region 101L of the semiconductor die 101' so that the sparse region 101L of the semiconductor die 101' will not deform in response to the vacuum suction force when thinned beyond a critical thickness, for example, less than 100 μm. In some embodiments, the anti-deformation means 5021 is at least one protrusions on the chuck table 502B, and the at least one protrusions is designed to insert into the tape 501 to occupy a volume at the vicinity of the sparse region 101L. The recess 505 of the tape 501 can be eliminated when a calculated volume is occupied by the at least one protrusions. As a result, as shown in FIG. 5C', no voids is presented between the tape and the chuck table 502B when the anti-deformation means 5021 is engaged to the tape over the sparse region 101L of the semiconductor die 101'.

FIG. 5A", FIG. 5B", and FIG. 5C" illustrate cross sectional views of intermediate products during various manufacturing operations of a semiconductor package according to some embodiments of the present disclosure. FIG. 5A" is similar to FIG. 5A except that a plurality of supporters 101LS are formed in the sparse region 101L as an anti-deformation means. As previously described, it is observable that an area density of the real conductive pillars 101HR in the dense region 100H is greater than an area density of the supporters 101LS in the sparse region 101L. In some embodiments, a volume density of the real conductive pillars 101HR in the dense region 101H or 101H' is greater than a volume density of the supporters 101LS in the sparse region 101L when a height of each of the conductive pillars 101HR, 101HR', and supporters 101LS is considered. For example, a volume density of the supporters 101LS in the sparse region 101L is in a range of from about 50% to about 100% to a volume density of the real conductive pillars 101HR or 101HR' in the dense region 101H or 101H'. The TTV of all conductive pillars can be effectively reduced when the aforesaid volume density is implemented.

Figure 6A:
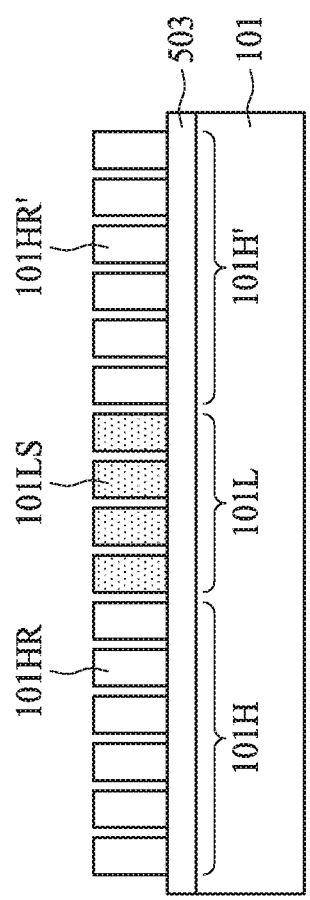
FIG. 6A illustrates a cross-sectional view of a semiconductor die according to some embodiments of the present disclosure.
Figure 7A:
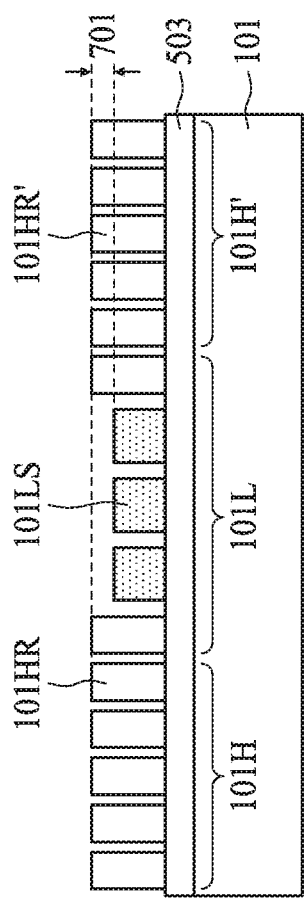
FIG. 7A illustrates a cross-sectional view of a semiconductor die according to some embodiments of the present disclosure.

In some embodiments, the plurality of real conductive pillars 101HR, 101HR' and supporters 101LS are formed by suitable electroplating operations. In some embodiments, the plurality of real conductive pillars 101HR, 101HR' and supporters 101LS are formed in a single electroplating operation, each of the plurality of real conductive pillars 101HR, 101HR', and supporters 101LS is approximately having a same height, as illustrated in FIG. 6A. In some embodiments, the plurality of real conductive pillars 101HR, 101HR' and supporters 101LS are formed in different electroplating operations, therefore each of the plurality of real conductive pillars 101HR, 101HR' and supporters 101LS may possess different heights, as illustrated in FIG. 7A. When applying the tape 501 over the active surface of the semiconductor die 101', no recess can be observed as opposed to the counterparts discussed in FIG. 5A and FIG. 5A' due to the presence of the supporters 101LS in the sparse region 101L. As a result, when the semiconductor die 101' is brought into contact with a chuck table 502C providing vacuum suction, as illustrated in FIG. 5B" and FIG. 5C", no voids is presented between the tape 501 and the chuck table 502C. Description FIG. 5C" can be referred to paragraphs addressing FIG. 5C and is not repeated here for brevity.

Figure 5D:
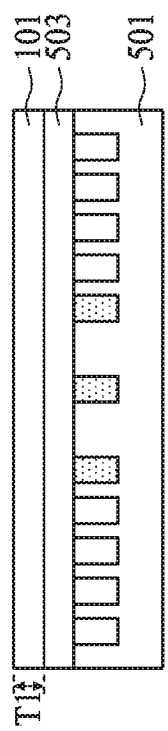
FIG. 5D and FIG. 5E illustrate cross sectional views of intermediate products during various manufacturing operations of a semiconductor package according to some embodiments of the present disclosure.
Figure 5D:
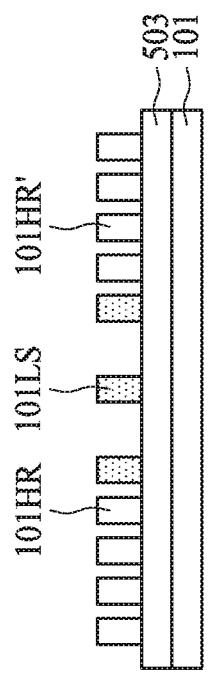
Figure 5E:
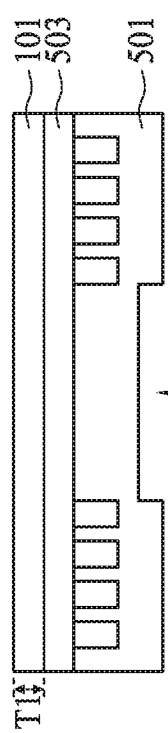
Figure 5E:
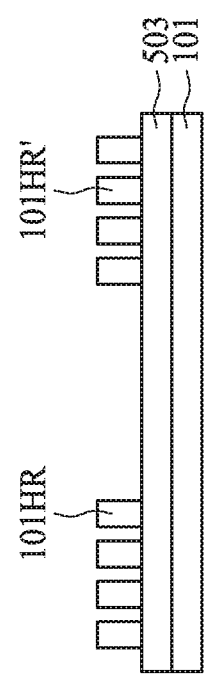

FIG. 5D and FIG. 5E illustrate cross sectional views of intermediate products during various manufacturing operations of a semiconductor package following FIG. 5A, FIG. 5B, FIG. 5C, and FIG. 5A', FIG. 5B', FIG. 5C' previously described. After disengaging the chuck table 502A, 502B, and the anti-deformation means 5020, 5021 from the thinned semiconductor die 101, recess 505 of the tape 501 is restored, as shown in FIG. 5D. At the completion of the thinning operation, the thickness T1 of the thinned semiconductor die 101 is less than about 100 μm, and no deformation is formed on the thinned semiconductor die 101. In FIG. 5E, the tape 501 is stripped to expose the plurality of real conductive pillars 101HR and 101HR'.

FIG. 5D' and FIG. 5E' illustrate cross sectional views of intermediate products during various manufacturing operations of a semiconductor package following FIG. 5A", FIG. 5B", FIG. 5C" previously described. After disengaging the chuck table 502C from the thinned semiconductor die 101, the tape 501 possesses a flat surface, as shown in FIG. 5D'. At the completion of the thinning operation, the thickness T1 of the thinned semiconductor die 101 is less than about 100 μm, and no deformation is formed on the thinned semiconductor die 101. In FIG. 5E', the tape 501 is stripped to expose the plurality of real conductive pillars 101HR, 101HR', and the plurality of supporters 101LS. As previously discussed, the supporters 101LS may include dummy conductive pillars and/or real conductive pillars.

Figure 6B:
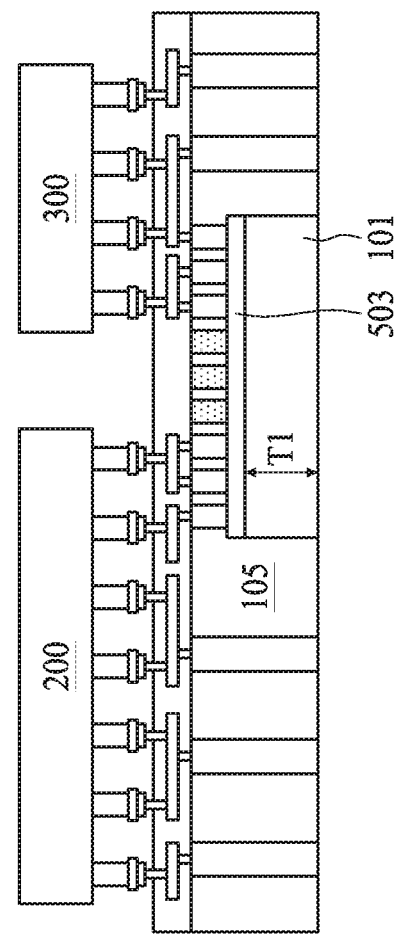
FIG. 6B illustrates a cross-sectional view of a semiconductor package including the semiconductor die of FIG. 6A.

FIG. 6A illustrates a cross-sectional view of a semiconductor die according to some embodiments of the present disclosure. As shown in FIG. 6A, the supporters 101LS in the sparse region 101L are having a same height. FIG. 6B illustrates a cross-sectional view of a semiconductor package including the semiconductor die of FIG. 6A. The semiconductor die 101 is electrically connected to the semiconductor die 200 and the semiconductor die 300 via a plurality of real conductive pillars 101HR, 101HR', and the conductive wiring layer 503 (e.g., an RDL). In some embodiments, the semiconductor die 101 is a bridge die connecting at least two semiconductor dies 200, 300. The more than one dense regions 101H, 101H' are overlapping with the semiconductor die 200 and semiconductor die 300, respectively.

Figure 7B:
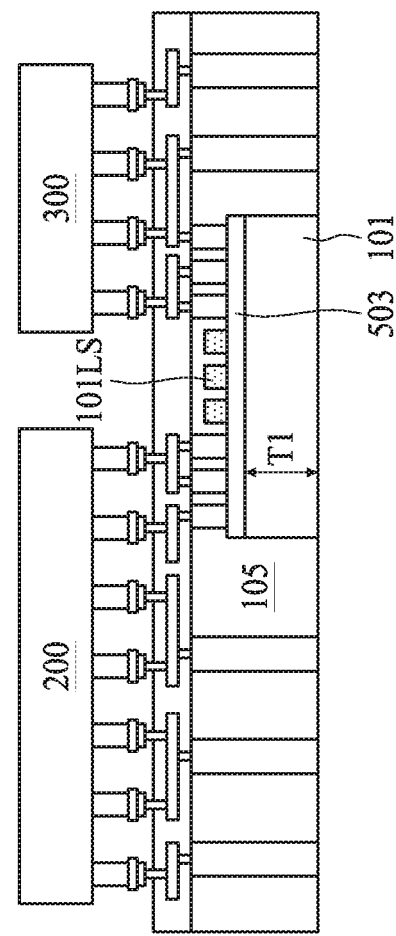
FIG. 7B illustrates a cross-sectional view of a semiconductor package including the semiconductor die of FIG. 7A.

FIG. 7A illustrates a cross-sectional view of a semiconductor die according to some embodiments of the present disclosure. As shown in FIG. 7A, the real conductive pillar 101HR, 101HR', and the supporters 101LS in the sparse region 101L are having different heights. A height difference 701 can be observed from a cross sectional perspective. FIG. 7B illustrates a cross-sectional view of a semiconductor package including the semiconductor die of FIG. 7A. The semiconductor die 101 is electrically connected to the semiconductor die 200 and the semiconductor die 300 via a plurality of real conductive pillars 101HR, 101HR', and the conductive wiring layer 503 (e.g., an RDL). In some embodiments, the semiconductor die 101 is a bridge die connecting at least two semiconductor dies 200, 300. The more than one dense regions 101H, 101H' are overlapping with the semiconductor die 200 and semiconductor die 300, respectively.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device, comprising:
   a semiconductor die having a first surface and a second surface opposite to the first surface;
   a plurality of first real conductive pillars in a first region on the first surface;
   a plurality of supporters in a second region adjacent to the first region; and
   a conductive wiring layer electrically coupled to the first real conductive pillars,
   wherein an area density of the plurality of supporters in the second region is in a range of from about 50% to about 100% of an area density of the plurality of first real conductive pillars in the first region.

2. The semiconductor device of claim 1, wherein the plurality of supporters comprise a dummy pillar.

3. The semiconductor package of claim 2, wherein the plurality of supporters further comprise a real conductive pillar.

4. The semiconductor device of claim 1, wherein a volume density of the plurality of supporters in the second region is in a range of from about 50% to about 100% of a volume density of the plurality of first real conductive pillars in the first region.

5. The semiconductor device of claim 1, wherein a shape of each of the supporters in the second region is different from a shape of each of the plurality of first real conductive pillar in the first region from a top view perspective.

6. The semiconductor device of claim 1, wherein a height of the each of the plurality of supporters in the second region is lower than a height of each of the plurality of first real conductive pillar in the first region.

7. The semiconductor device of claim 1, wherein a thickness of the semiconductor die is less than about 100 μm.

8. The semiconductor package of claim 1, further comprising an encapsulant surrounding the first real conductive pillars in the first region and the supporters in the second region.

9. A semiconductor package, comprising:
   a first semiconductor die having a first surface and a second surface opposite to the first surface;
   a plurality of first real conductive pillars in a first dense region on the first surface;
   a plurality of second real conductive pillars in a second dense region on the first surface;
   a plurality of supporters in a sparse region between the first dense region and the second dense region;
   a second semiconductor die over the first semiconductor die;
   a first conductive wiring layer between the first semiconductor die and the second semiconductor die; and
   a third semiconductor die over the first semiconductor die.

10. The semiconductor package of claim 9, wherein the second semiconductor die overlaps with the first real conductive pillars and the third semiconductor die overlaps with the second real conductive pillars.

11. The semiconductor package of claim 9, wherein an area density of the plurality of supporters in the sparse region is in a range of from about 50% to about 100% of an area density of the plurality of first real conductive pillars in the first dense region.

12. The semiconductor package of claim 9, wherein a shape of each of the plurality of supporters in the sparse region is different from a shape of each of the plurality of first real conductive pillar in the first dense region from a top view perspective.

13. The semiconductor package of claim 9, wherein the first semiconductor die is a bridge die.

14. The semiconductor package of claim 9, wherein the second semiconductor die comprises a plurality of conductive terminals on an active surface of the second semiconductor die, and the conductive terminals overlap with and are electrically connected to the first real conductive pillars in the first dense region.

15. The semiconductor package of claim 14, further comprising a substrate carrying the first semiconductor die, wherein the substrate comprises a plurality of conductive terminals having a size that is finer than a size of the conductive terminals of the second semiconductor die.

16. The semiconductor package of claim 9, wherein a volume density of the plurality of supporters in the sparse region is in a range of from about 50% to about 100% of a volume density of the plurality of first real conductive pillars in the first dense region.

17. The semiconductor package of claim 9, further comprising an encapsulant surrounding the plurality of first real conductive pillars in the first dense region, the plurality of second real conductive pillars in the second dense region, and the plurality of supporters in the sparse region.

18. The semiconductor package of claim 17, further comprising a second conductive wiring layer proximal to the second surface of the first semiconductor die, wherein the second conductive wiring layer is electrically connected to the first surface of the first semiconductor die via a through via in the encapsulant, the first conductive wiring layer, and any one of the first real conductive pillars, the second real conductive pillars, and the supporters.

* * * * *